(12) United States Patent
Kimura et al.

(10) Patent No.: US 9,552,826 B2
(45) Date of Patent: Jan. 24, 2017

(54) FREQUENCY CHARACTERISTIC MODIFICATION DEVICE

(71) Applicants: Masaru Kimura, Chiyoda-ku (JP); Takashi Yamazaki, Chiyoda-ku (JP)

(72) Inventors: Masaru Kimura, Chiyoda-ku (JP); Takashi Yamazaki, Chiyoda-ku (JP)

(73) Assignee: Mitsubishi Electric Corporation, Chiyoda-ku (JP)

(*) Notice: Subject to any disclaimer, the term of this patent is extended or adjusted under 35 U.S.C. 154(b) by 189 days.

(21) Appl. No.: 14/373,721

(22) PCT Filed: Dec. 14, 2012

(86) PCT No.: PCT/JP2012/082546
§ 371 (c)(1),
(2) Date: Jul. 22, 2014

(87) PCT Pub. No.: WO2013/183185
PCT Pub. Date: Dec. 12, 2013

(65) Prior Publication Data
US 2015/0030181 A1    Jan. 29, 2015

(30) Foreign Application Priority Data

Jun. 4, 2012  (WO) .................. PCT/JP2012/064383

(51) Int. Cl.
*G10L 21/0208* (2013.01)
*H04R 3/04* (2006.01)
(Continued)

(52) U.S. Cl.
CPC ....... *G10L 21/0208* (2013.01); *G10L 21/0232* (2013.01); *H03G 5/165* (2013.01);
(Continued)

(58) Field of Classification Search
CPC .......... H04R 3/04; H03G 5/165; H03G 9/025; H03G 9/005; G10L 21/0232; G10L 21/0208
(Continued)

(56) References Cited

U.S. PATENT DOCUMENTS 6,865,274 B1    3/2005    Aarts et al.
2008/0170723 A1    7/2008    Sakagami et al.
2008/0273718 A1    11/2008    Ohkuri et al.

FOREIGN PATENT DOCUMENTS

CN    1801611 A    7/2006
JP    59-25822    2/1984
(Continued)

OTHER PUBLICATIONS

International Search Report issued Mar. 19, 2013, in PCT/JP12/082546 filed Dec. 14, 2012.
(Continued)

*Primary Examiner* — David Ton
(74) *Attorney, Agent, or Firm* — Oblon, McClelland, Maier & Neustadt, L.L.P.

(57) ABSTRACT

A device includes a HPF 702 that modifies frequency characteristics of a target signal; a phase correcting unit 701 that corrects the phase characteristics of the target signal to make the phase characteristics nearly equal to phase characteristics of the HPF 702; a first multiplier 705 that adjusts the gain of the signal output from the phase correcting unit 701; a second multiplier 706 that adjusts the gain of the signal output from the HPF 702; a coefficient determining unit that determines the gain coefficients of the first and second multipliers 705 and 706 in such a manner that the sum of the gain coefficient of the first multiplier 705 and the gain coefficient of the second multiplier 706 becomes a fixed
(Continued)

value; and an adder 713 that adds the two signals output from the first multiplier 705 and second multiplier 706.

11 Claims, 12 Drawing Sheets

(51) Int. Cl.
    *H03G 5/16*           (2006.01)
    *H03G 9/00*           (2006.01)
    *H03G 9/02*           (2006.01)
    *G10L 21/0232*     (2013.01)

(52) U.S. Cl.
    CPC ............. *H03G 9/005* (2013.01); *H03G 9/025*
                         (2013.01); *H04R 3/04* (2013.01)

(58) Field of Classification Search
    USPC .......... 381/96–98, 101–103, 94.1–94.3, 94.9
    See application file for complete search history.

(56)               References Cited

FOREIGN PATENT DOCUMENTS

| | | |
|---|---|---|
| JP | 8-213862 | 8/1996 |
| JP | 2003-503989 | 1/2003 |
| JP | 2008-263583 | 10/2008 |
| JP | 2009-147701 | 7/2009 |
| JP | 2011-114772 | 6/2011 |
| WO | WO 2006/093256 A1 | 9/2006 |

OTHER PUBLICATIONS

Office Action mailed Sep. 26, 2016 in Chinese Application No. 201280071005.2 (w/English translation).

Addition of Harmonics Increases with Attenuation of Low-Frequency Range

FREQUENCY CHARACTERISTIC MODIFICATION DEVICE

TECHNICAL FIELD

The present invention relates to a signal processing technique for improving distortion or crackling noise in audio signal reproduction.

BACKGROUND ART

As for a speaker reproduction system that reproduces an audio signal such as music or announcement with a speaker, there are some cases where the quality of sound deteriorates because of distortion or crackling noise. The cause of the distortion or crackling noise is divided broadly into two categories. The first is the case where the input signal to a speaker is distorted, and the second is the case where the distortion or crackling noise occurs because the input signal exceeds the reproduction limit of a speaker even though it does not have distortion.

The first case can be explained as follows. Recently, an increasing number of audio signal reproduction systems correct the frequency characteristics or adjust the volume by digital processing. As for the correction of the frequency characteristics, if a high frequency component is increased by 10 dB, for example, there is a possibility that the digital signal saturates at the volume not less than −10 dBFS. Here, 0 dBFS represents the maximum amplitude of the digital signal. Accordingly, the reproduced sound is digitally distorted at high volume so that the quality of sound deteriorates. FIG. 2 shows its behavior.

In FIG. 2, the vertical axis shows the amplitude intensity of the digital signal, and the horizontal axis shows the frequency. In addition, the region where the signal is saturated and the crackling noise occurs is shown by gray, and the border is denoted by a thick line. Reference numerals 201, 202 and 203 designate an example of frequency characteristics of the digital audio signal with its frequency characteristics being corrected: 201 denotes the characteristics when the volume is low; 202 designates the characteristics when the volume is moderate; and 203 denotes the characteristics when the volume is high. At the volume designated by 201 or 202, since the audio signal does not exceed 0 dBFS, no crackling noise occurs, which enables enjoying the original quality of sound. However, if the volume is increased as denoted by 203, the signal intensity of a part of the high frequency component exceeds 0 dBFS and is saturated digitally. If the signal saturates, it causes distortion or crackling noise, which deteriorates the quality of sound.

Thus, when trying to reproduce the digital signal with its frequency characteristics being corrected at a high volume, there are some cases where a particular frequency component exceeds 0 dBFS, the maximum amplitude of the digital signal. This will cause the saturation of the signal, which brings about the distortion or crackling noise.

Next, the second case will be described which will bring about distortion or crackling noise because of exceeding the reproduction limit of the speaker.

Concerning the speaker reproduction, the diaphragm of a speaker has a maximum displacement it can vibrate. If a signal exceeding it is input, the speaker diaphragm cannot vibrate well, which can cause distortion or crackling noise. Here, the displacement of the speaker diaphragm depends on the frequency of the input signal. FIG. 3 shows the relationships. FIG. 3 shows the displacement of the speaker diaphragm when a signal is input to a speaker while varying only its frequency with its voltage (V) being maintained. In FIG. 3, although the actual characteristics around F0 vary in such a manner as to become rounder or flatter than those of FIG. 3 because of the difference in the Q-value representing the damping degree, a general tendency is consistent. In addition, since the present invention is applicable to a speaker with characteristics different from the displacement characteristics shown in FIG. 3, the following description will be made on the assumption that the displacement characteristics of the speaker diaphragm are as shown in FIG. 3 for the sake of convenience of description.

As shown in FIG. 3, the displacement of the speaker diaphragm is approximately constant at frequency components lower than F0 (the minimum resonant frequency of the speaker), and decreases with a slope of about −12 dB/oct for the frequency components higher than F0. This indicates that the speaker diaphragm vibrates with a greater displacement when the lower frequency components near F0 are input to the speaker than when the higher frequency components are input. Accordingly, when the signal including a lot of low frequency components are input to the speaker and its voltage is raised, its displacement will exceed the maximum displacement of the diaphragm at a certain voltage or higher. In other words, as the signal includes more low frequency components and its voltage increases, it is likely that the displacement will exceed the reproduction limit of the speaker. FIG. 4 shows the behavior.

In FIG. 4, the vertical axis shows the amplitude intensity of the signal, and the horizontal axis shows its frequency. Besides, the region where the displacement exceeds the displacement limit of the speaker diaphragm and hence the crackling noise can occur is shown in gray, and its border is indicated by a thick line. Here, since the characteristics of FIG. 4 are characteristics for the amplitude of the audio signal, the displacement limit of the speaker diaphragm has a slope of +12 dB/oct which differs from the slope of the characteristics of the displacement of the speaker shown in FIG. 3.

In addition, reference numerals 401, 402 and 403 denote frequency characteristics of the audio signal reproduced with the speaker on the assumption that the signal includes a lot of low frequency components in particular. The reference numeral 401 designates the characteristics when the volume is low, 402 denotes the characteristics when the volume is moderate, and 403 designates the frequency characteristics when the volume is high. As long as the reproduction is carried out at the low volume as indicated by 401, even the audio signal including a lot of low frequency components does not cause the speaker diaphragm to exceed its maximum displacement. Thus, the crackling noise does not occur, which enables enjoying the original quality of sound. However, as denoted by 402 or 403, when the volume is raised, the speaker diaphragm will exceed its maximum displacement, which can cause distortion or crackling noise to occur, and deteriorate the quality of sound.

In this way, when the signal that will cause the diaphragm to exceed the maximum displacement is input, the diaphragm cannot vibrate well, thereby resulting in the distortion or crackling noise.

Since the distortion or crackling noise is not contained in the original audio signal, they will greatly hamper enjoying music.

With regard to this problem, the distortion or crackling noise is conventionally reduced by a processing configuration as shown in FIG. 17. In FIG. 17, the configuration passes an input signal 1301 through a HPF (high-pass filter)

1302 that suppresses the low frequency components, and outputs a signal 1303. Since the configuration can suppress the low frequency components that will cause the crackling noise before inputting to the speaker, it can reduce the ratio of producing the distortion or crackling noise. However, since the conventional technique suppresses the low frequency components through the HPF 1302, even when the signal to be reproduced has only a small amount of low frequency components and the crackling noise does not occur when driving the speaker with high voltage, since the low frequency components are always suppressed, it offers a problem of being unable to reproduce the original sound. In addition, even when the crackling noise will not occur without passing through the high-pass filter 1302 because the driving voltage of the speaker is not so high, the conventional technique always suppresses the low frequency components, which offers a problem of being unable to reproduce the original sound. In other words, the conventional technique has a problem of hampering a listener from enjoying the original quality of sound by excessively suppressing the low frequency components to prevent the crackling noise at the large voltage driving (at the high volume).

As a technique to relieve the problems, there is a technique disclosed in Patent Document 1, for example. FIG. 18 is a block diagram of the processing of an amplitude limiting device disclosed in a Patent Document 1. According to the Patent Document 1, in the amplitude limit for suppressing the excessive input, it detects the amount of distortion due to amplitude limit characteristics, and controls the gain of each frequency band in accordance with the amount, thereby reducing the deterioration of the quality of sound due to the amplitude limit.

PRIOR ART DOCUMENT

Patent Document

Patent Document 1: Japanese Patent Laid-Open No. 2009-147701.

DISCLOSURE OF THE INVENTION

Problems to be Solved by the Invention

However, the technique disclosed in the foregoing Patent Document 1 has a problem of deteriorating the quality of sound by excessively suppressing a frequency component that is not to be suppressed originally because a frequency component to be suppressed is fixed to a bandwidth of the division. For example, consider the case where a bandwidth of a subband divided by a BPF (band-pass filter) is 100 Hz. In this case, if a signal which has a high intensity frequency component at 60 Hz or less is input, the crackling noise can be prevented primarily by only suppressing the signal component of 60 Hz or less. The foregoing technique, however, suppresses the intensity of the entire signal component from 0 to 100 Hz, thereby suppressing the component (component from 60 to 100 Hz) other than the frequency component to be suppressed. In addition, although the displacement of the speaker diaphragm has frequency characteristics as shown in FIG. 3, the amplitude limiting device disclosed in the Patent Document 1 does not have the processing configuration that reflects the frequency characteristics of the displacement. Accordingly, it may safely be said that it does not have a function of preventing the crackling noise produced if the displacement exceeds the maximum displacement of the speaker diaphragm.

The present invention is implemented to solve the foregoing problems. Therefore it is an object of the present invention to provide a frequency characteristic modification device capable of preventing the distortion and crackling noise at the speaker reproduction while maintaining the quality of sound.

Means for Solving the Problem

A frequency characteristic modification device in accordance with the present invention comprises; a filter that modifies frequency characteristics of a target signal; a phase correcting unit that corrects phase characteristics of the target signal to make the phase characteristics nearly equal to phase characteristics of the filter; a first multiplier that adjusts gain of a signal output from the phase correcting unit; a second multiplier that adjusts gain of a signal output from the filter; a coefficient determining unit that determines gain coefficients of the first and second multipliers in a manner that a sum of the gain coefficient of the first multiplier and the gain coefficient of the second multiplier becomes a constant value; and an adder that adds the two signals supplied from the first multiplier and second multiplier.

Advantages of the Invention

According to the present invention, it can offer a frequency characteristic modification device capable of preventing the distortion or crackling noise in the speaker reproduction while maintaining the quality of sound.

BEST MODE FOR CARRYING OUT THE INVENTION

The best mode for carrying out the invention will now be described with reference to the accompanying drawings to explain the present invention in more detail.

Embodiment 1

Figure 1:
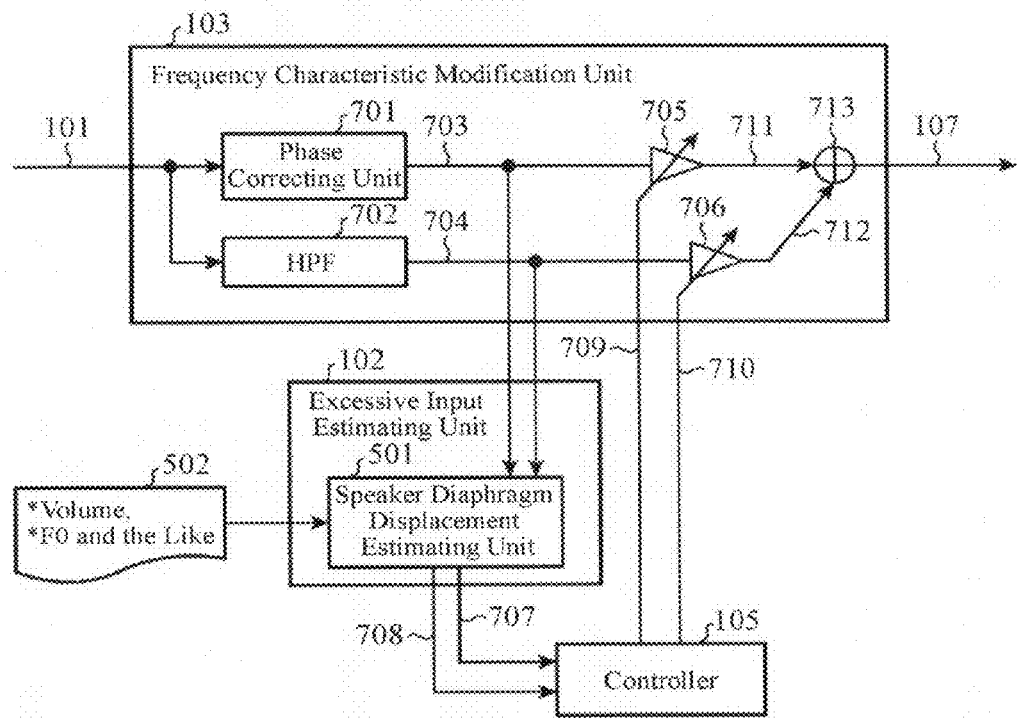
FIG. 1 is a diagram showing a principle of a frequency characteristic modification device of an embodiment 1.
Figure 2:
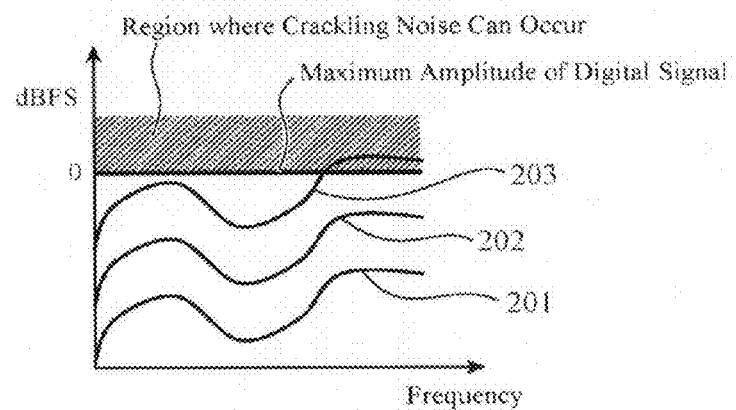
FIG. 2 is a diagram illustrating relationships between amplitude limits of a digital signal and frequency characteristics of a sound source.
Figure 3:
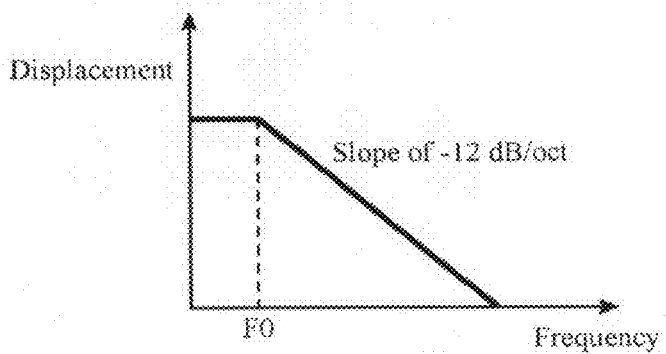
FIG. 3 is a diagram illustrating displacement characteristics of a speaker diaphragm.
Figure 4:
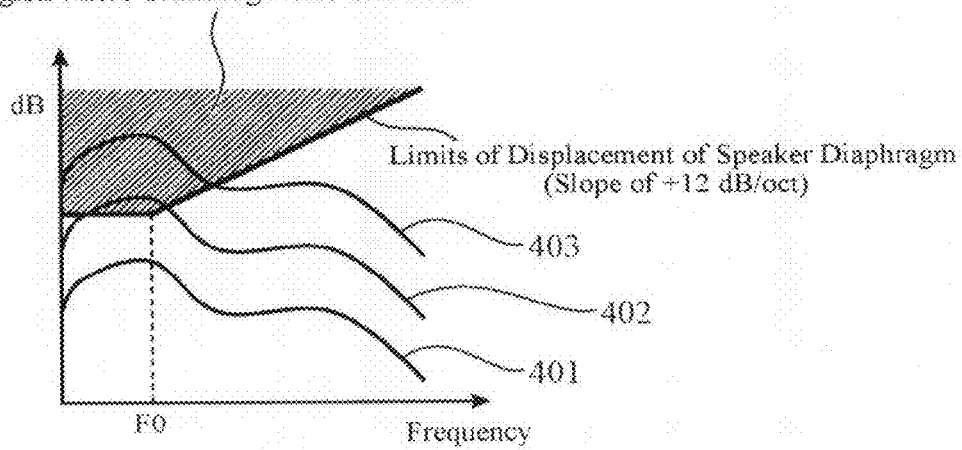
FIG. 4 is a diagram illustrating relationships between vibration limits of a speaker and frequency characteristics of a sound source.

FIG. 1 is a diagram showing an embodiment in accordance with the present invention. The operation of the present embodiment will be described below.

An input signal 101 supplied to a frequency characteristic modification device in accordance with the present invention is split and delivered to a phase correcting unit 701 and HPF 702.

The phase correcting unit 701, while maintaining the frequency amplitude characteristics of the input signal, corrects only its phase characteristics in such a manner that the phase characteristics become nearly equal to the phase characteristics of the HPF 702, and supplies a resultant signal 703 to a first multiplier 705 and an excessive input estimating unit 102.

The HPF 702 carries out the filter processing of the input signal 101, and supplies a resultant signal 704 to a second multiplier 706 and the excessive input estimating unit 102.

Here, a method of implementing the phase correcting unit 701 that corrects the phase in such a manner as to become nearly equal to the phase characteristics of the HPF 702 will be described below. When implementing the HPF 702 with a single stage of a second-order IIR filter, its phase characteristics rotate just 90 degrees at the cutoff frequency and gradually rotate at the following frequency components until 180 degrees. The phase correcting unit 701 that will achieve such phase characteristics can be constructed by an all-pass filter based on a first-order IIR filter. In addition, when implementing the HPF with two stages of second-order IIR filters, its phase characteristics rotate just 180 degrees at the cutoff frequency and gradually rotate at the following frequency components until 360 degrees. The phase correcting unit that will achieve such phase characteristics can be constructed by an all-pass filter based on a second-order IIR filter. In addition, when implementing the HPF with N stages of second-order IIR filters, the same phase characteristics can be achieved by appropriately connecting all-pass filters of the first-order IIR and all-pass filters of the second-order IIR in series. In addition, when implementing the HPF with an FIR filter, since the phase characteristics have a linear phase, the phase correcting unit 701 can be configured by sampling-delay processing. Thus, the phase correcting unit 701 with the same phase characteristics as the HPF 702 can be implemented.

The excessive input estimating unit 102 of the present embodiment comprises a speaker diaphragm displacement estimating unit 501. The speaker diaphragm displacement estimating unit 501 estimates the displacement of the speaker diaphragm when reproducing the signal 703 by using information 502 such as the volume and F0 of the target speaker, and obtains a first speaker diaphragm displacement 707. Likewise, it estimates the displacement of the speaker diaphragm when reproducing the signal 704, and obtains a second speaker diaphragm displacement 708. As a concrete example of the displacement estimation, a LPF using a second-order IIR filter with a cutoff frequency F0 is prepared. Then passing the input signal through the LPF, followed by multiplying the volume, will give a value approximately proportional to the displacement of the target speaker. In addition, since the LPF using the second-order IIR filter can alter its Q-value, it can improve the estimation accuracy by varying the Q-value in response to the damping degree of the target speaker. It goes without saying that other methods are possible such as simulating the displacement characteristics of the diaphragm of the target speaker by an FIR filter.

The two speaker diaphragm displacements 707 and 708 thus obtained is supplied to the controller 105.

The controller 105 obtains the two gain coefficients in such a manner that when the two input speaker diaphragm displacements 707 and 708 are multiplied by the gain coefficients which differ from each other, respectively, followed by addition, the absolute value of the amplitude comes within a prescribed threshold, where the sum of the two gain coefficients is assumed to be one.

Figure 5:
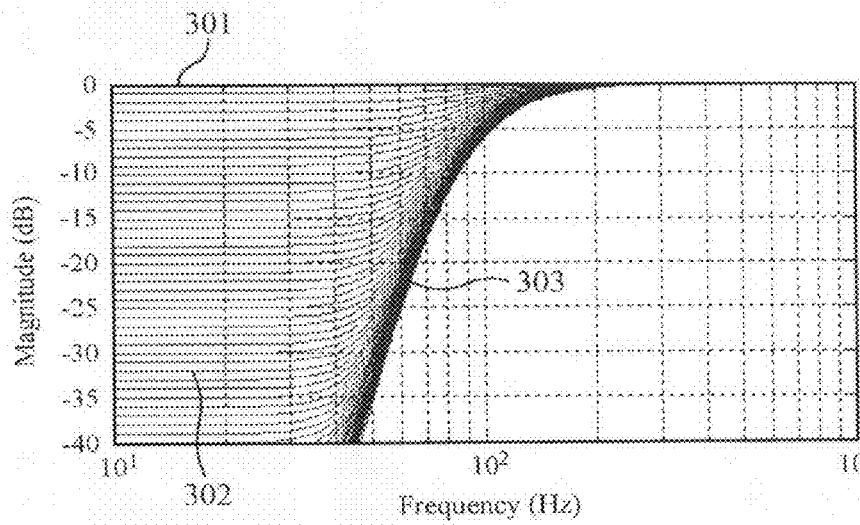
FIG. 5 is a diagram showing transition of frequency characteristics due to two gains of the frequency characteristic modification device of the embodiment 1.

Varying the two gain coefficients under such conditions can implement different low-frequency range attenuation effects. FIG. 5 shows transitions of frequency characteristics due to the two gain coefficients when implementing the HPF 702 with two stages of the second-order IIR filters with a cutoff frequency of 80 Hz and implementing the phase correcting unit 701 with a single stage of the all-pass filter of a second-order IIR with a cutoff frequency of 80 Hz. In addition, assuming that the gain coefficient for the speaker diaphragm displacement 707 is A1, and the gain coefficient for the speaker diaphragm displacement 708 is A2 in FIG. 5, the line 301 shows characteristics of A1=1.0 and A2=0.0, and the curve 302 shows characteristics of A1=0.1 and A2=0.9, and the curve 303 shows characteristics of A1=0.0 and A2=1.0. This indicates that different low frequency attenuation characteristics can be implemented between the completely flat characteristics (A1=1.0, A2=0.0) and the same characteristics as the two stages of the second-order IIR filters with the cutoff frequency of 80 Hz (A1=0.0, A2=1.0). In addition, as for the frequency components not less than the cutoff frequency, since the components with the same phase are added at the ratios of one in total, the flat characteristics can be maintained without any fluctuations of intensity.

A concrete method of calculating such two gain coefficients can be implemented by obtaining A1 and A2 that will satisfy the following Expression (1), in which X1 is the speaker diaphragm displacement 707, X2 is the speaker diaphragm displacement 707, A1 is the gain coefficient corresponding to X1, A2 is the gain coefficient corresponding to X2, and T is the prescribed threshold.

$$T > ABS(X1*A1 + X2*A2)$$

$$A1 + A2 = 1 \qquad (1)$$

where ABS(x) denotes the absolute value of x.

In addition, to limit the modification of the frequency characteristics to a minimum necessary amount, it is desirable to obtain a combination in which the value A1 is close to one among the combinations of A1 and A2 that satisfy the foregoing Expression (1). This is because A1 is the signal resulting from the correction of only the phase characteristics, and as A1 approaches one, the frequency characteristics have less modification. To obtain such gain coefficients, place A1=1 at first, obtain ABS(X1*A1+X2*A2) while gradually reducing the value A1, and adopt the values A1 and A2 when ABS(X1*A1+X2*A2) becomes less than T.

The value A1 thus obtained is supplied to the first multiplier 705 as the gain coefficient 709. In addition, the value A2 is supplied to the second multiplier 706 as the gain coefficient 710.

The first multiplier 705 multiplies the input signal 703 by the gain coefficient 709, and supplies the resultant signal 711 to an adder 713.

The second multiplier 706 multiplies the input signal 704 by the gain coefficient 710, and supplies the resultant signal 712 to the adder 713.

The adder 713 adds the two input signals 711 and 712, and outputs the resultant signal as the output signal 107.

As described above, the processing configuration of the embodiment 1 can prevent the reproduced audio signal from becoming an excessive input. Consequently, according to the present invention, it offers an advantage of being able to reduce the distortion and crackling noise. In addition, lowering the cutoff frequency as much as possible by the controller offers an advantage of being able to prevent the distortion and crackling noise with the minimum necessary frequency characteristic modification.

Embodiment 2

Figure 6:
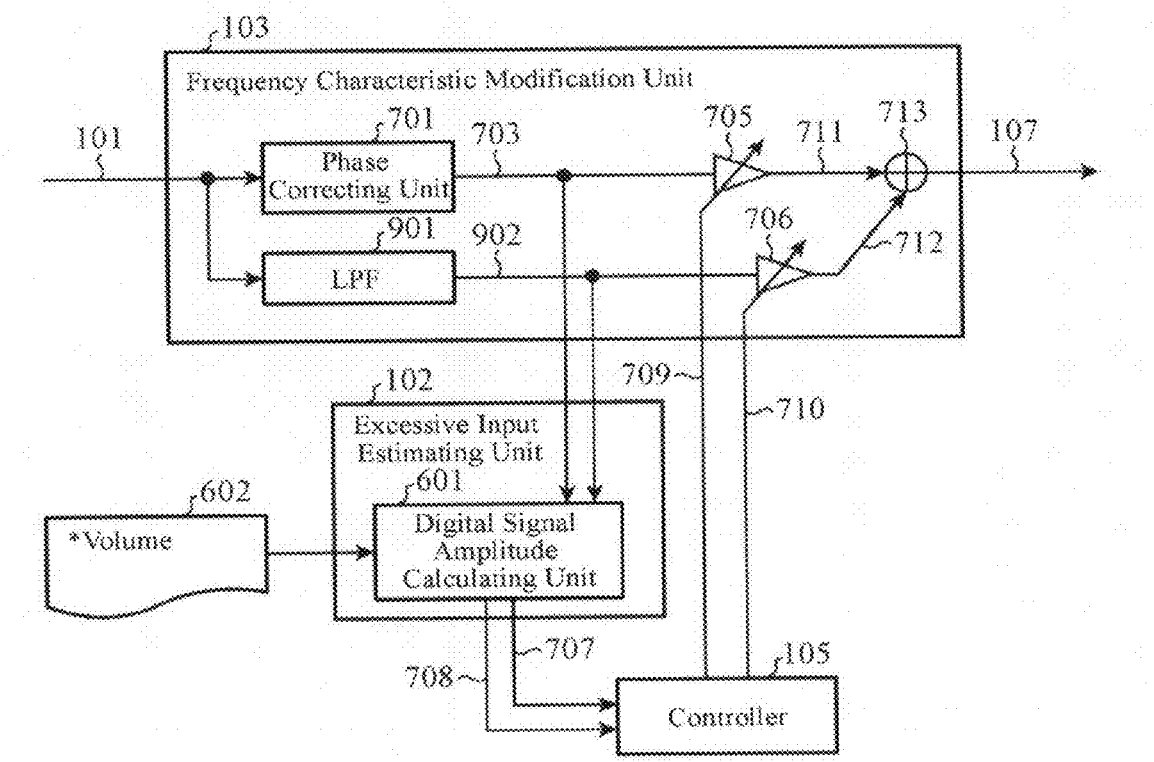
FIG. 6 is a diagram showing a principle of a frequency characteristic modification device of an embodiment 2.

As for the digital audio signal passing through the frequency characteristic correction that much corrects its high frequency components, replacing the HPF 702 described in the embodiment 1 by a LPF will enable modifying the frequency characteristics of the signal so as not to exceed the maximum amplitude of the digital signal. FIG. 6 shows a processing configuration of an embodiment which replaces the HPF 702 by a LPF.

The input signal 101 supplied to the frequency characteristic modification device in accordance with the present invention is split and is delivered to the phase correcting unit 701 and LPF 901.

The phase correcting unit 701, while maintaining the frequency amplitude characteristics of the input signal, corrects only its phase characteristics in such a manner that the phase characteristics become nearly equal to the phase characteristics of the LPF 901, and supplies the resultant signal 703 to the first multiplier 705 and excessive input estimating unit 102.

The LPF 901 carries out the filter processing of the input signal 101, and supplies the resultant signal 902 to the second multiplier 706 and excessive input estimating unit 102.

Here, since the phase correcting unit 701 can be implemented by an all-pass filter or sampling-delay processing in the same manner as that of the embodiment 1, its detailed description will be omitted.

The excessive input estimating unit 102 of the present embodiment comprises a digital signal amplitude calculating unit 601. The digital signal amplitude calculating unit 601 obtains the first amplitude 707 by multiplying the volume 602 and the input signal 703. Likewise, it obtains the second amplitude 708 by multiplying the volume 602 and the input signal 902.

The two amplitudes 707 and 708 thus obtained are supplied to the controller 105.

The controller 105 obtains the two gain coefficients in such a manner that when the two input amplitudes 707 and 708 are multiplied by two different gain coefficients, respectively, followed by addition, the absolute value of the amplitude comes within a prescribed threshold, where the sum of the two gain coefficients is assumed to be one. In addition, although the prescribed threshold is usually set at 0 dBFS, it is not limited to that. For example, it can be set at a value lower than that if the matching between the speaker input tolerance and the amplifier output is not established and if it is desirable to limit the output of the amplifier.

Figure 7:
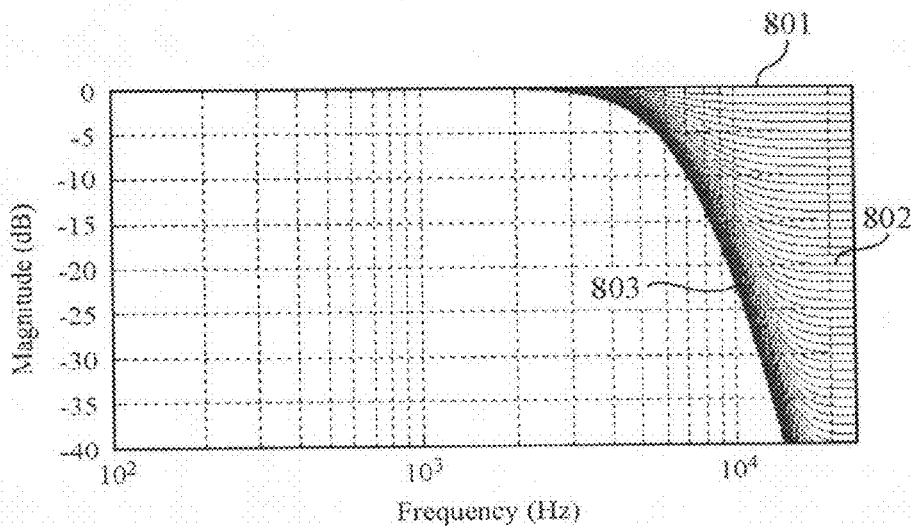
FIG. 7 is a diagram illustrating transition of frequency characteristics due to two gains of the frequency characteristic modification device of the embodiment 2.

Varying the two gain coefficients under such conditions can implement different high frequency attenuation effect. FIG. 7 shows transitions of frequency characteristics due to the two gain coefficients when implementing the LPF 702 with two stages of second-order IIR filters with a cutoff frequency of 6000 Hz and implementing the phase correcting unit 701 with a single stage of a second-order IIR all-pass filter with a cutoff frequency of 6000 Hz. In addition, assuming that the gain coefficient for the speaker diaphragm displacement 707 is A1, and the gain coefficient for the speaker diaphragm displacement 708 is A2 in FIG. 7, the line 801 shows characteristics of A1=1.0 and A2=0.0, the curve 802 shows characteristics of A1=0.1 and A2=0.9, and the curve 803 shows characteristics of A1=0.0 and A2=1.0. This indicates that different high frequency attenuation characteristics can be implemented from the completely flat characteristics (A1=1.0, A2=0.0) to the characteristics of the two stages of the second-order 11R filters with the cutoff frequency of 6000 Hz (A1=0.0, A2=1.0). In addition, as for the frequency components not greater than the cutoff frequency, since the components with the same phase are added at the ratios of one in total, the flat characteristics can be maintained without any fluctuations of intensity. As for a concrete calculation method of the two gain coefficients, since it calculates them in the same manner as that of the embodiment 1, the description thereof will be omitted.

The value A1 thus obtained is supplied to the first multiplier 705 as the gain coefficient 709. Likewise, the value A2 is supplied to the second multiplier 706 as the gain coefficient 710.

The first multiplier 705 multiplies the input signal 703 by the gain coefficient 709, and supplies the resultant signal 711 to the adder 713.

The second multiplier 706 multiplies the input signal 704 by the gain coefficient 710, and supplies the resultant signal 712 to the adder 713.

The adder 713 adds the two input signals 711 and 712, and outputs the resultant signal as the output signal 107.

As described above, the processing configuration of the embodiment 2 can suppress the amplitude of the digital audio signal which much corrects the high-frequency component, offering an advantage of being able to reduce the distortion and crackling noise. In addition, since the controller of the present embodiment can make the cutoff frequency of the LPF as high as possible, it offers an advantage of being able to prevent the distortion and crackling noise by the minimum necessary modification of the frequency characteristics.

Embodiment 3

Although the frequency characteristic modification unit is implemented by the single phase correcting unit and the single HPF or LPF in the embodiment 1 or 2, this is not essential. The frequency characteristic modification unit can be implemented by a plurality of phase correcting units and a plurality of HPFs or LPFs.

Figure 8:
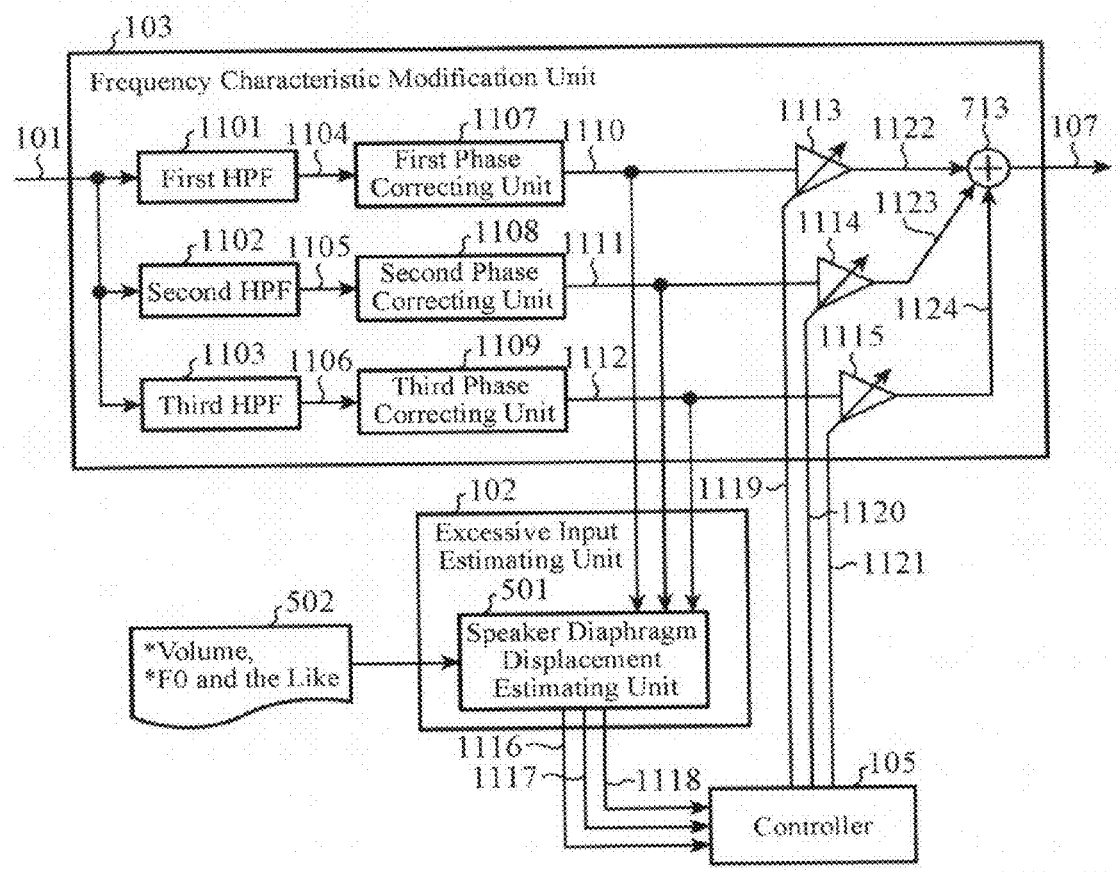
FIG. 8 is a diagram showing a principle of a frequency characteristic modification device of an embodiment 3.

FIG. 8 is a diagram showing an example that implements the frequency characteristic modification unit using three phase correcting units and three HPFs. The operation of the present embodiment will be described below.

The input signal 101 supplied to the frequency characteristic modification device in accordance with the present invention is split to three, and is delivered to a first HPF 1101, a second HPF 1102, and a third HPF 1103.

The first HPF 1101 carries out the filter processing of the input signal, and supplies the resultant signal 1104 to a first phase correcting unit 1107.

The second HPF 1102 carries out the filter processing of the input signal, and supplies the resultant signal 1105 to a second phase correcting unit 1108.

The third HPF 1103 carries out the filter processing of the input signal, and supplies the resultant signal 1106 to a third phase correcting unit 1109.

The first phase correcting unit 1107, while maintaining the frequency amplitude characteristics of the signal, corrects only the phase characteristics of the signal in such a manner that the phase characteristics become nearly equal to the phase characteristics when the processing of both the second HPF 1102 and third HPF 1103 has been executed, and supplies the resultant signal 1110 to a first multiplier 1113 and the excessive input estimating unit 102.

The second phase correcting unit 1108, while maintaining the frequency amplitude characteristics of the signal, corrects only the phase characteristics of the signal in such a manner that the phase characteristics become nearly equal to the phase characteristics when the processing of both the first HPF 1101 and third HPF 1103 has been executed, and supplies the resultant signal 1111 to a second multiplier 1114 and the excessive input estimating unit 102.

The third phase correcting unit 1109, while maintaining the frequency amplitude characteristics of the signal, corrects only the phase characteristics of the signal in such a manner that the phase characteristics become nearly equal to the phase characteristics when the processing of both the first HPF 1101 and the second HPF 1102 has been executed, and supplies the resultant signal 1112 to a third multiplier 1115 and the excessive input estimating unit 102.

Here, since each phase correcting unit can be implemented by an all-pass filter or sampling-delay processing as in the embodiment 1, the detailed description will be omitted.

The excessive input estimating unit 102 of the present embodiment comprises the speaker diaphragm displacement estimating unit 501. The speaker diaphragm displacement estimating unit 501 estimates the displacement of the speaker diaphragm when reproducing the signal 1110 using the information 502 such as the volume and F0 of the target speaker, and obtains the first speaker diaphragm displacement 1116. Likewise, it estimates the displacement of the speaker diaphragm when reproducing the signal 1111, and obtains the second speaker diaphragm displacement 1117. Likewise, it estimates the displacement of the speaker diaphragm when reproducing the signal 1112, and obtains the third speaker diaphragm displacement 1118.

As for a concrete example of the displacement estimation, since it is obtained in the same manner as that of the embodiment 1, its detailed description will be omitted.

The three speaker diaphragm displacements 1116, 1117 and 1118 thus obtained are supplied to the controller 105.

The controller 105 obtains three gain coefficients in such a manner that when the three input speaker diaphragm displacements 1116, 1117 and 1118 are multiplied by gain coefficients which differ from each other, respectively, followed by addition, the absolute value of the amplitude comes within the prescribed threshold, where the sum of the three gain coefficients is assumed to be one.

Figure 9:
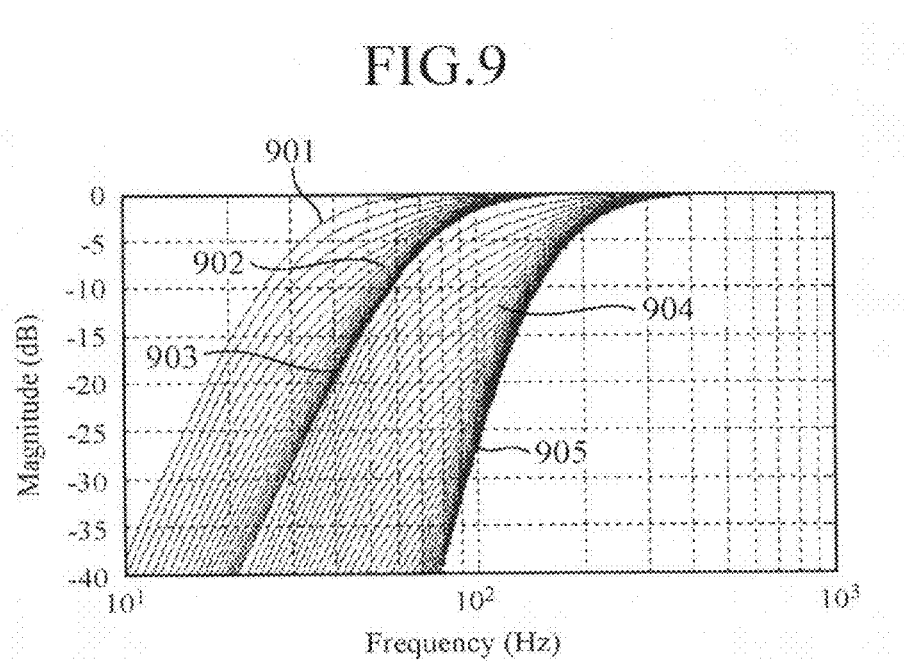
FIG. 9 is a diagram illustrating transition of frequency characteristics due to three gains of the frequency characteristic modification device of the embodiment 3.

Varying the three gain coefficients under such conditions can implement different low-frequency range attenuation effects. FIG. 9 shows transition of frequency characteristics due to the three gain coefficients when implementing the first HPF 1101 with two stages of the second-order IIR filters with a cutoff frequency of 30 Hz, the second HPF 1102 with two stages of the second-order IIR filters with a cutoff frequency of 70 Hz, and the third HPF 1103 with four stages of the second-order IIR filters with a cutoff frequency of 140 Hz, and implementing the first phase correcting unit 1107 with a series connection of a single stage of the second-order IIR filter with a cutoff frequency of 70 Hz and two stages of the second-order IIR filters with a cutoff frequency of 140 Hz, the second phase correcting unit 1108 with a series connection of a single stage of the second-order IIR filter with a cutoff frequency of 30 Hz and two stages of the second-order IIR filters with a cutoff frequency of 140 Hz, and the third phase correcting unit 1109 with a series connection of a single stage of the second-order IIR filter with a cutoff frequency of 30 Hz and a single stage of the second-order IIR filter with a cutoff frequency of 70 Hz.

In addition, in FIG. 9, assuming that the gain coefficient for the speaker diaphragm displacement 1116 is A1, the gain coefficient for the speaker diaphragm displacement 1117 is A2, and the gain coefficient for the speaker diaphragm displacement 1118 is A3, then the curve 901 indicates the characteristics when A1=1.0, A2=0.0 and A3=0.0; the curve 902 indicates the characteristics when A1=0.1, A2=0.9 and A3=0.0; the curve 903 indicates the characteristics when A1=0.0, A2=1.0 and A3=0.0; the curve 904 indicates the characteristics when A1=0.0, A2=0.1 and A3=0.9; and the curve 905 indicates the characteristics when A1=0.0, A2=0.0 and A3=1.0. This indicates that different low frequency attenuation characteristics can be implemented from the characteristics of the two stages of the second-order IIR filters with the cutoff frequency of 30 Hz (A1=1.0, A2=0.0, A3=0.0) to the characteristics of the four stages of the second-order IIR filters with the cutoff frequency of 140 Hz (A1=0.0, A2=0.0, A3=1.0). In addition, as for the frequency components not less than the cutoff frequency, since the components with the same phase are added at the ratios of one in total, the flat characteristics can be maintained without any fluctuations of intensity.

In addition, a concrete method of calculating such three gain coefficients can be implemented by obtaining A1, A2 and A3 that will satisfy the following Expression (2), in which X1 is the speaker diaphragm displacement 1116, X2 is the speaker diaphragm displacement 1117, X3 is the speaker diaphragm displacement 1118, A1 is the gain coefficient for X1, A2 is the gain coefficient for X2, A3 is the gain coefficient for X3, and T is the prescribed threshold.

$$T > ABS(X1*A1 + X2*A2 + X3*A3)$$

$$A1 + A2 + A3 = 1 \qquad (2)$$

where ABS(x) denotes the absolute value of x.

The value A1 thus obtained is supplied to the first multiplier 1113 as the gain coefficient 1119. Likewise, the value A2 is supplied to the second multiplier 1114 as the gain coefficient 1120, and the value A3 is supplied to the third multiplier 1115 as the gain coefficient 1121.

The first multiplier 1113 multiplies the input signal 1110 by the gain coefficient 1119, and supplies the resultant signal 1122 to the adder 713.

The second multiplier 1114 multiplies the input signal 1111 by the gain coefficient 1120, and supplies the resultant signal 1123 to the adder 713.

The third multiplier 1115 multiplies the input signal 1112 by the gain coefficient 1121, and supplies the resultant signal 1124 to the adder 713.

The adder 713 adds the three input signals 1122, 1123 and 1124, and outputs the resultant signal as the output signal 107.

As described above, the processing configuration of the embodiment 3 offers an advantage of being able to implement the frequency characteristic modification unit with the three phase correcting units and the three HPFs, and to enable the frequency characteristic modification unit to achieve the characteristics closer to a common HPF than the embodiment 1.

It goes without saying that increasing the number of the phase correcting units and that of the HPFs can implement the characteristics further closer to a common HPF. In addition, as for the digital audio signal passing through the frequency characteristic correction having much correction in the high frequency components, replacing the HPFs of the configuration by LPFs will be able to modify the frequency characteristics of the signal so as not to exceed the maximum amplitude of the digital signal.

Embodiment 4

Figure 10:
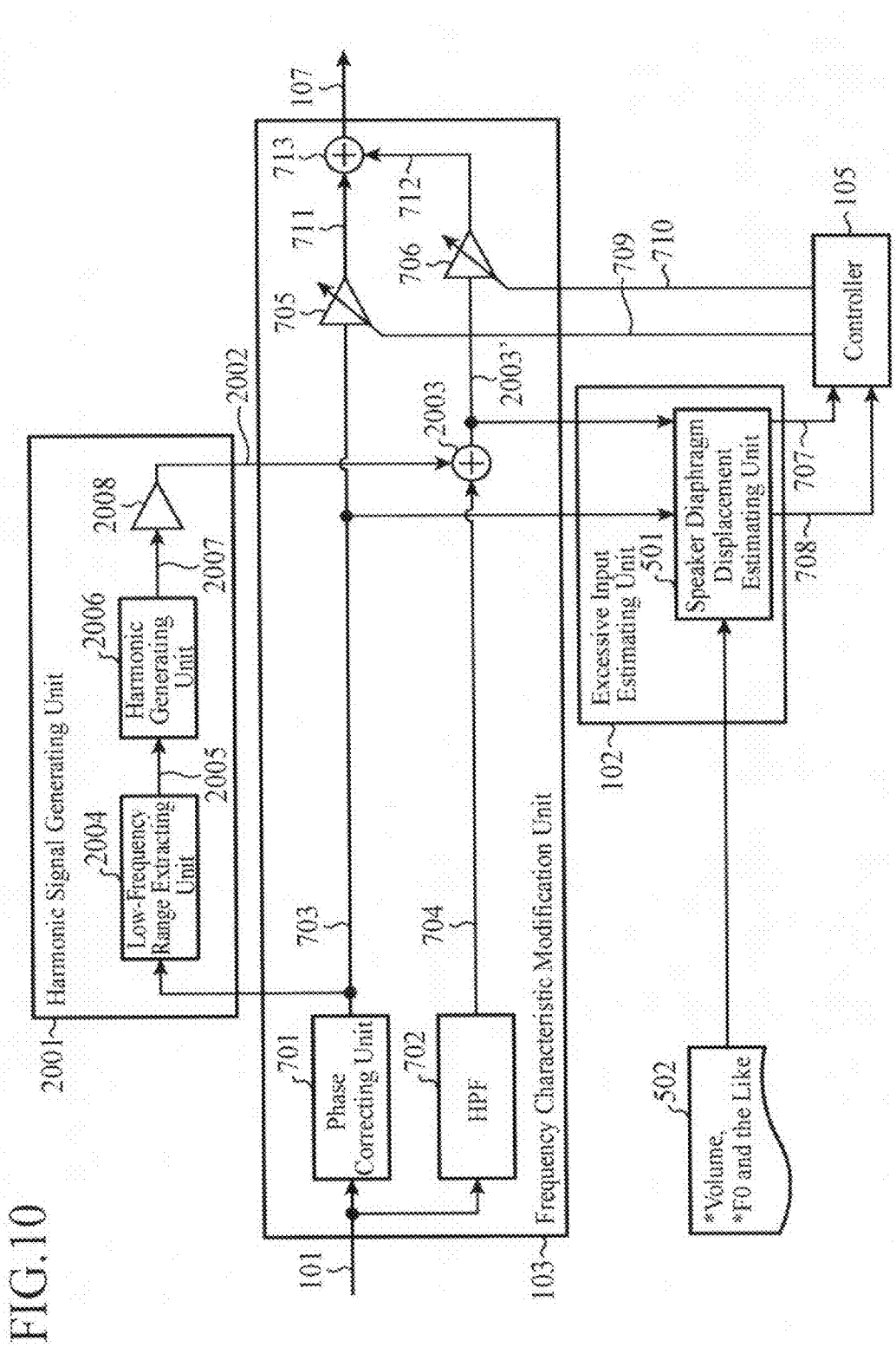
FIG. 10 is a diagram showing a principle of a frequency characteristic modification device of an embodiment 4.

FIG. 10 is a diagram showing another embodiment in accordance with the present invention. The present embodiment shows an example that cuts off a low-frequency range through a high-pass filter, generates harmonics of the low-frequency range, and adds them. The operation of the present embodiment will be described below.

The input signal 101 input to a frequency characteristic modification device in accordance with the present invention is split and delivered to the phase correcting unit 701 and HPF 702.

The phase correcting unit 701, while maintaining the frequency amplitude characteristics of the input signal, corrects only its phase characteristics in such a manner that the phase characteristics become nearly equal to the phase characteristics of the HPF 702, and supplies the resultant signal 703 to the first multiplier 705, excessive input estimating unit 102 and a harmonic signal generating unit 2001.

The HPF 702 carries out the filter processing of the input signal 101, and supplies the resultant signal 704 to an adder 2003.

Here, since the phase correcting unit can be implemented using an all-pass filter or a sampling-delay processing as in the embodiment 1, the detailed description thereof will be omitted.

The harmonic signal generating unit 2001 comprises a low-frequency range extracting unit 2004, a harmonic generating unit 2006 and a multiplier 2008.

Figure 11:
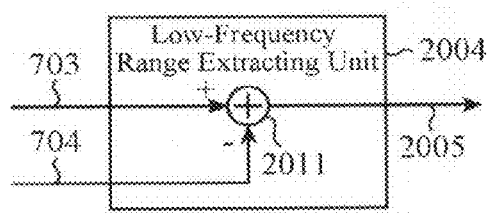
FIG. 11 is a diagram showing an example of a low-frequency range extracting unit of the frequency characteristic modification device of the embodiment 4.
Figure 12:
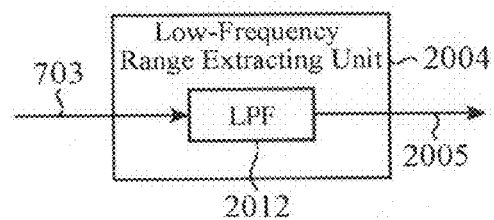
FIG. 12 is a diagram showing another example of the low-frequency range extracting unit of the frequency characteristic modification device of the embodiment 4.

The low-frequency range extracting unit 2004, receiving the output signal 703 of the phase correcting unit 701, extracts the low-frequency range cutoff through the HPF 702, and supplies the resultant signal 2005 to the harmonic generating unit 2006. Here, as for a method of implementing the low-frequency range extracting unit 2004 that extracts the low-frequency range cut off through the HPF 702, there is a method of configuring it with a difference calculator 2011 as shown in FIG. 11 and obtaining the resultant signal by subtracting the output signal 704 of the HPF 702 from the output signal 703 of the phase correcting unit 701, or a method of configuring it with a LPF 2012 as shown in FIG. 12, and passing the output signal 703 of the phase correcting unit 701 through the filter with the same filter specifications as the HPF 702.

The harmonic generating unit 2006 generates the harmonics of the output signal 2005 of the low-frequency range extracting unit 2004 up to an nth order (where n is an integer equal to or greater than three), and supplies the resultant signal 2007 to the multiplier 2008. Here, as for a method of implementing the harmonic generating unit 2006, it can be a method of generating both odd harmonics and even harmonics through waveform transformation such as peak hold, full-wave rectification, and half-wave rectification or through m-times of multiplication of the signal 2005 (where m is an integer) or frequency division.

The multiplier 2008 multiplies the output signal 2007 of the harmonic generating unit 2006 by a gain coefficient a user desires, and supplies the resultant signal 2002 to the adder 2003. Here, the gain coefficient the multiplier 2008 multiplies can be a plurality of fixed gain coefficients prepared in advance, which can be changed in accordance with the liking of the user.

The adder 2003 adds the two input signals 704 and 2002, and supplies the resultant signal 2003' to the excessive input estimating unit 102 and second multiplier 706.

The excessive input estimating unit 102 of the present embodiment comprises the speaker diaphragm displacement estimating unit 501. The speaker diaphragm displacement estimating unit 501 estimates the displacement of the speaker diaphragm when reproducing the signal 703 using the information 502 such as the volume and F0 of the target speaker, and obtains the first speaker diaphragm displacement 707. Likewise, it estimates the displacement of the speaker diaphragm when reproducing the signal 2003', and obtains the second speaker diaphragm displacement 708.

As for a concrete example of the displacement estimation, since it is obtained in the same manner as that of the embodiment 1, its detailed description will be omitted.

The two speaker diaphragm displacements 707 and 708 the speaker diaphragm displacement estimating unit 501 obtains are supplied to the controller 105.

The controller 105 obtains two gain coefficients in such a manner that when the two input speaker diaphragm displacements 707 and 708 are multiplied by the gain coefficients which differ from each other, respectively, followed by addition, the absolute value of the amplitude comes within the prescribed threshold, where the sum of the two gain coefficients is assumed to be one.

Varying the two gain coefficients under such conditions can implement different low-frequency range attenuation effects. Since a concrete example of the low-frequency range attenuation effects has the same characteristics as that of the embodiment 1, the detailed description thereof will be omitted.

Figure 13:
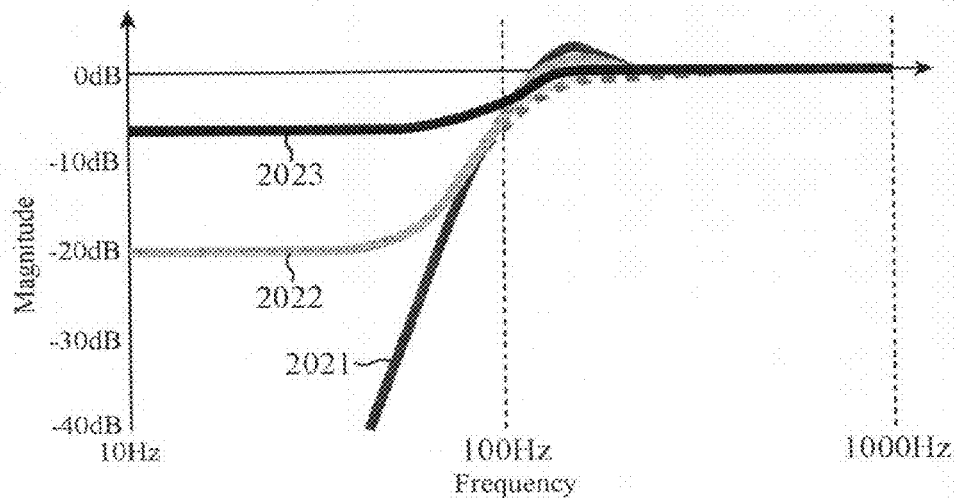
FIG. 13 is a diagram illustrating an addition image of harmonics corresponding to the low-frequency range attenuation effect of the embodiment 4.

In addition, the amount of addition of the harmonics of the cutoff low-frequency range can be altered in accordance with the low-frequency range attenuation effects. FIG. 13 shows addition images of the harmonics in accordance with the low-frequency range attenuation effects when implementing the HPF 702 with two stages of second-order IIR filters with a cutoff frequency of 80 Hz and implementing the phase correcting unit 701 with a single stage of a second-order IIR all-pass filter with the cutoff frequency of 80 Hz.

In FIG. 13, assuming that the gain coefficient for the speaker diaphragm displacement 707 is A1, and the gain coefficient for the speaker diaphragm displacement 708 is A2, then the curve 2021 indicates the characteristic image when A1=0.0 and A2=1.0, the curve 2022 indicates the characteristic image when A1=0.1 and A2=0.9, and the curve 2023 indicates the characteristic image when A1=0.5 and A2=0.5. This shows that as the value A2 increases and the amount of attenuation of the low-frequency range increases, an increasing number of harmonics in the low-frequency range not greater than 80 Hz are added.

In addition, since a concrete calculation method of the gain coefficients A1 and A2 is the same as that of the embodiment 1, the description thereof will be omitted.

The value A1 the controller 105 obtains is supplied to the first multiplier 705 as the gain coefficient 709. Likewise, the value A2 the controller 105 obtains is supplied to the second multiplier 706 as the gain coefficient 710.

The first multiplier 705 multiplies the input signal 703 by the gain coefficient 709, and supplies the resultant signal 711 to the adder 713.

The second multiplier 706 multiplies the input signal 2003' by the gain coefficient 710 and supplies the resultant signal 712 to the adder 713.

The adder 713 adds the two input signals 711 and 712, and outputs the resultant signal as the output signal 107.

As described above, according to the processing configuration of the embodiment 4, the frequency characteristic modification unit cuts off the low-frequency range, and the harmonic signal generating unit generates the harmonics of the low-frequency range up to the nth order (n is an integer not less than three), which offers an advantage of being able to cause an user to perceive the cutoff low-frequency range virtually due to the psychoacoustic feature "Missing fundamental". In addition, since the controller controls both the output signal of the HPF and the gain of the harmonic signal generated, it can vary the low-frequency range interpolation effect in accordance with the attenuation characteristics of the low-frequency range.

Here, the term "Missing fundamental" refers to an audio illusion that when hearing a sound with two or more frequencies, one perceives as if he or she heard a sound with a difference frequency between the two or more frequencies.

Embodiment 5

Although the embodiment 4 implements the frequency characteristic modification unit with the single phase correcting unit and the single HPF, this is not essential. For example, the frequency characteristic modification unit can be implemented with a plurality of phase correcting units and a plurality of HPFs.

Figure 14:
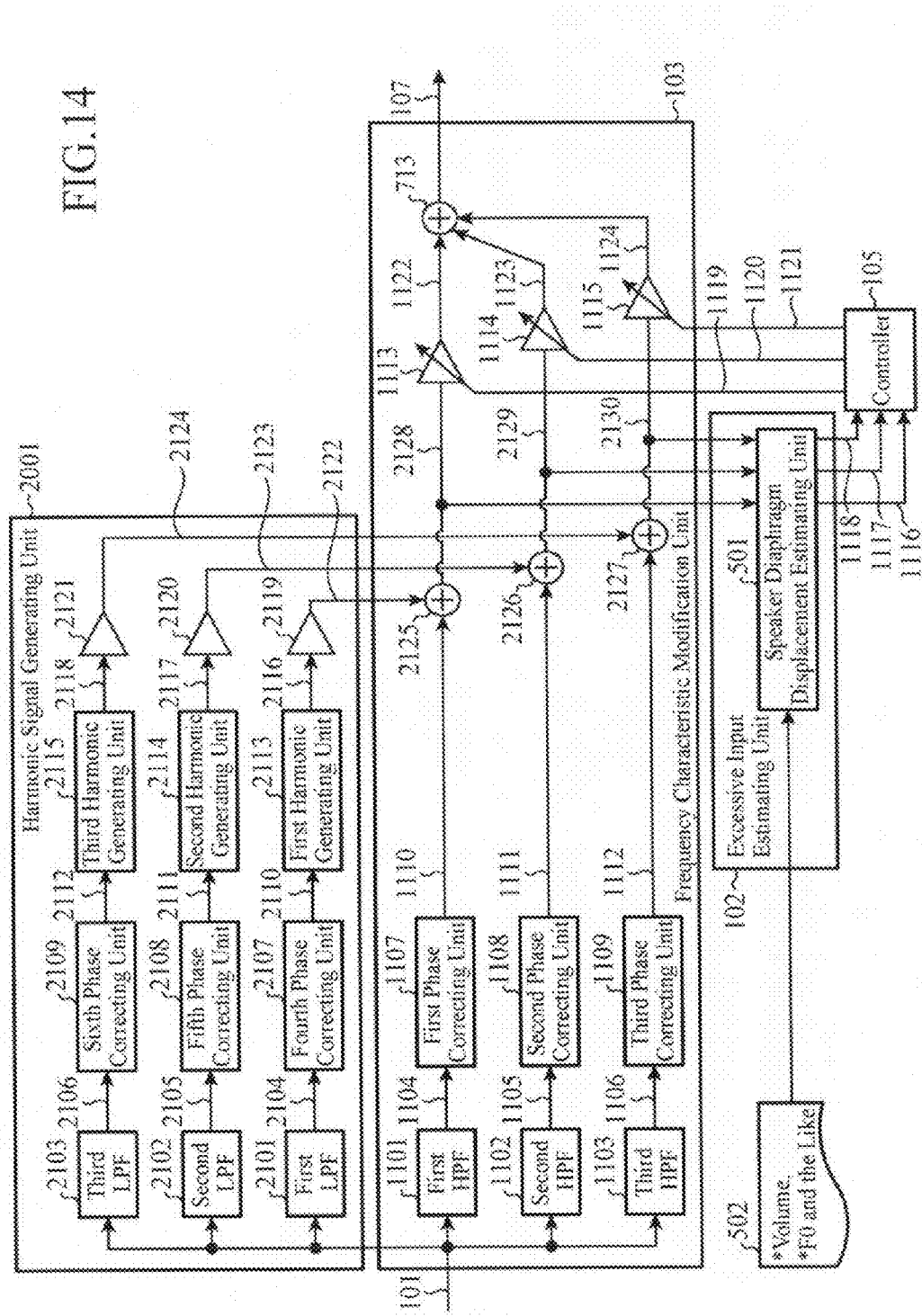
FIG. 14 is a diagram showing a principle of a frequency characteristic modification device of an embodiment 5.

FIG. 14 is a diagram showing an example that implements the frequency characteristic modification unit with three phase correcting units and three HPFs. The operation of the present embodiment will be described below.

The input signal 101 supplied to the frequency characteristic modification device in accordance with the present invention is divided into six, and is delivered to a first HPF 1101, a second HPF 1102 and a third HPF 1103, and to a first LPF 2101, a second LPF 2102, and a third LPF 2103.

The first HPF 1101 carries out the filter processing of the input signal, and supplies the resultant signal 1104 to the first phase correcting unit 1107.

The second HPF 1102 carries out the filter processing of the input signal, and supplies the resultant signal 1105 to the second phase correcting unit 1108.

The third HPF 1103 carries out the filter processing of the input signal, and supplies the resultant signal 1106 to the third phase correcting unit 1109.

The first phase correcting unit 1107, while maintaining the frequency amplitude characteristics of the signal, corrects only the phase characteristics of the signal in such a manner that the phase characteristics become nearly equal to the phase characteristics when the processing of both the second HPF 1102 and third HPF 1103 has been executed, and supplies the resultant signal 1110 to an adder 2125.

The second phase correcting unit 1108, while maintaining the frequency amplitude characteristics of the signal, corrects only the phase characteristics of the signal in such a manner that the phase characteristics become nearly equal to the phase characteristics when the processing of both the first HPF 1101 and third HPF 1103 has been executed, and supplies the resultant signal 1111 to an adder 2126.

The third phase correcting unit 1109, while maintaining the frequency amplitude characteristics of the signal, corrects only the phase characteristics of the signal in such a manner that the phase characteristics become nearly equal to the phase characteristics when the processing of both the first HPF 1101 and the second HPF 1102 has been executed, and supplies the resultant signal 1112 to an adder 2127.

Here, since each phase correcting unit can be implemented by an all-pass filter or sampling-delay processing as in the embodiment 1, the detailed description will be omitted.

The first LPF 2101 carries out the processing of the input signal 101 with a filter having similar specifications as the first HPF 1101, and supplies the resultant signal 2104 to a fourth phase correcting unit 2107.

The second LPF 2102 carries out the processing of the input signal 101 with a filter having similar specifications as the second HPF 1102, and supplies the resultant signal 2105 to a fifth phase correcting unit 2108.

The third LPF 2103 carries out the processing of the input signal 101 with a filter having similar specifications as the third HPF 1103, and supplies the resultant signal 2106 to a sixth phase correcting unit 2109.

The fourth phase correcting unit 2107, while maintaining the frequency amplitude characteristics of the signal, corrects only the phase characteristics of the signal in such a manner that the phase characteristics become nearly equal to the phase characteristics when the processing of both the second LPF 2102 and third LPF 2103 has been executed, and supplies the resultant signal 2110 to a first harmonic generating unit 2113.

The fifth phase correcting unit 2108, while maintaining the frequency amplitude characteristics of the signal, corrects only the phase characteristics of the signal in such a manner that the phase characteristics become nearly equal to the phase characteristics when the processing of both the first LPF 2101 and third LPF 2103 has been executed, and supplies the resultant signal 2111 to a second harmonic generating unit 2114.

The sixth phase correcting unit 2109, while maintaining the frequency amplitude characteristics of the signal, corrects only the phase characteristics of the signal in such a manner that the phase characteristics become nearly equal to the phase characteristics when the processing of both the first LPF 2101 and second LPF 2101 has been executed, and supplies the resultant signal 2112 to a third harmonic generating unit 2115.

The first harmonic generating unit 2113 generates harmonics of the signal 2110 and supplies the resultant signal 2116 to a multiplier 2119.

The second harmonic generating unit 2114 generates harmonics of the signal 2111 and supplies the resultant signal 2117 to a multiplier 2120.

The third harmonic generating unit 2115 generates harmonics of the signal 2112 and supplies the resultant signal 2118 to a multiplier 2121.

Here, as for a method of implementing each harmonic generating unit, it can be a method of generating both odd harmonics and even harmonics through waveform transformation such as peak hold, full-wave rectification, and half-wave rectification or through m-times of multiplication of the signal (where m is an integer) or frequency division.

The multiplier 2119 multiplies the signal 2116 by a gain coefficient a user desires, and supplies the resultant signal 2122 to the adder 2125.

The multiplier 2120 multiplies the signal 2117 by a gain coefficient the user desires, and supplies the resultant signal 2123 to the adder 2126.

The multiplier 2121 multiplies the signal 2118 by a gain coefficient the user desires, and supplies the resultant signal 2124 to the adder 2127.

Here, as for the gain coefficients the multipliers 2119, 2120 and 2121 multiply, they are prepared in advance as fixed gain coefficients, and are altered in accordance with the desire of the user.

The adder 2125 adds the two input signals 1110 and 2122, and supplies the resultant signal 2128 to the excessive input estimating unit 102 and first multiplier 1113.

The adder 2126 adds the two input signals 1111 and 2123, and supplies the resultant signal 2129 to the excessive input estimating unit 102 and second multiplier 1114.

The adder 2127 adds the two input signals 1112 and 2124, and supplies the resultant signal 2130 to the excessive input estimating unit 102 and third multiplier 1115.

The excessive input estimating unit 102 comprises the speaker diaphragm displacement estimating unit 501. The speaker diaphragm displacement estimating unit 501 estimates the displacement of the speaker diaphragm when reproducing the signal 2128 using the information 502 such as the volume and F0 of the target speaker, and obtains the first speaker diaphragm displacement 1116. Likewise, it estimates the displacement of the speaker diaphragm when reproducing the signal 2129, and obtains the second speaker diaphragm displacement 1117. Likewise, it estimates the displacement of the speaker diaphragm when reproducing the signal 2130, and obtains the third speaker diaphragm displacement 1118.

As for a concrete example of the displacement estimation, since it is obtained in the same manner as that of the embodiment 1, its detailed description will be omitted.

The three speaker diaphragm displacements 1116, 1117 and 1118 the speaker diaphragm displacement estimating unit 501 obtains are supplied to the controller 105.

The controller 105 obtains three gain coefficients in such a manner that when the three input speaker diaphragm displacements 1116, 1117 and 1118 are multiplied by the gain coefficients which differ from each other, respectively, followed by addition, the absolute value of the amplitude comes within a prescribed threshold, where the sum of the three gain coefficients is assumed to be one.

Varying the three gain coefficients under such conditions can implement different low-frequency range attenuation effects. As for a concrete example of the low-frequency range attenuation effects, since it has the same characteristics as that of embodiment 3, the detailed description thereof will be omitted.

In addition, the amount of addition of the harmonics of the cutoff low-frequency range can be altered in accordance with the low-frequency range attenuation effects.

Figure 15:
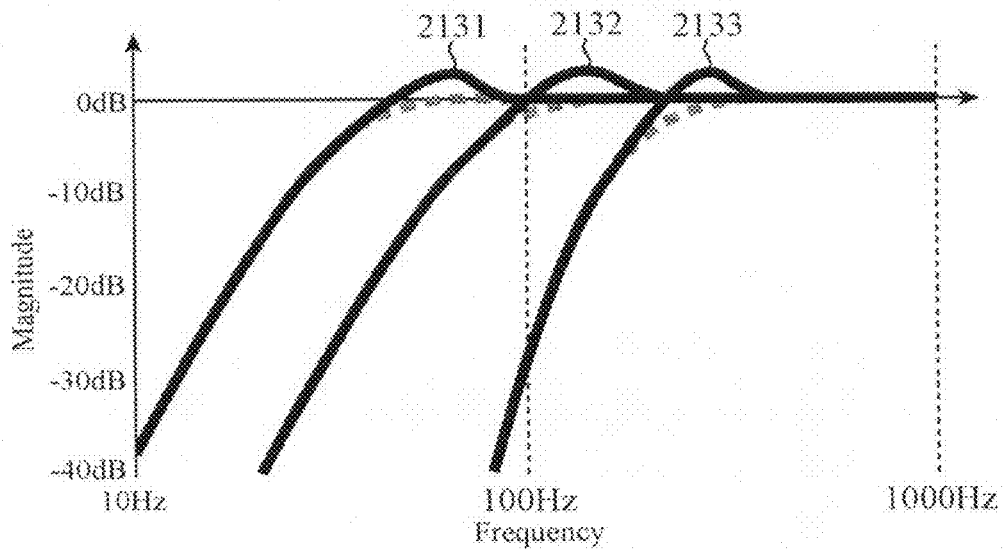
FIG. 15 is a diagram illustrating an addition image of harmonics corresponding to the low-frequency range attenuation effect of the embodiment 5.

FIG. 15 shows addition images of the harmonics corresponding to the low-frequency range attenuation effects when implementing the first HPF 1101 with two stages of the second-order IIR filters with a cutoff frequency of 30 Hz, the second HPF 1102 with two stages of the second-order IIR filters with a cutoff frequency of 70 Hz, and the third HPF 1103 with four stages of the second-order IIR filters with a cutoff frequency 140 Hz, and implementing the first phase correcting unit 1107 with a series connection of a single stage of the second-order IIR filter with a cutoff frequency of 70 Hz and two stages of the second-order IIR filters with a cutoff frequency of 140 Hz, the second phase correcting unit 1108 with a series connection of a single stage of the second-order IIR filter with a cutoff frequency of 30 Hz and two stages of the second-order IIR filters with a cutoff frequency of 140 Hz, and the third phase correcting unit 1109 with a series connection of a single stage of the second-order IIR filter with a cutoff frequency of 30 Hz and a single stage of the second-order IIR filter with a cutoff frequency of 70 Hz.

In FIG. 15, assuming that the gain coefficient for the speaker diaphragm displacement 1116 is A1, the gain coefficient for the speaker diaphragm displacement 1117 is A2, and the gain coefficient for the speaker diaphragm displacement 1118 is A3, then the curve 2131 indicates the characteristics when A1=1.0, A2=0.0 and A3=0.0; the curve 2132 indicates the characteristics when A1=0.1, A2=0.9 and A3=0.0; the curve 2133 indicates the characteristics when A1=0.0, A2=0.0 and A3=1.0. This indicates that the harmonics in the cutoff low-frequency range through the HPF are added to the frequency band on the cutoff band.

In addition, as for a concrete method of calculating the gain coefficients A1, A2 and A3, since they are obtained by the same method as that of the embodiment 3, the description thereof will be omitted.

The value A1 the controller 105 obtains is supplied to the first multiplier 1113 as the gain coefficient 1119. Likewise, the value A2 is supplied to the second multiplier 1114 as the gain coefficient 1120. In addition, the value A3 is supplied to the third multiplier 1115 as the gain coefficient 1121.

The first multiplier 1113 multiplies the input signal 2128 by the gain coefficient 1119, and supplies the resultant signal 1122 to the adder 713.

The second multiplier 1114 multiplies the input signal 2129 by the gain coefficient 1120, and supplies the resultant signal 1123 to the adder 713.

The third multiplier 1115 multiplies the input signal 2130 by the gain coefficient 1121, and supplies the resultant signal 1124 to the adder 713.

The adder 713 adds the three input signals 1122, 1123 and 1124, and outputs the resultant signal as the output signal 107.

As described above, according to the processing configuration of the embodiment 5, the frequency characteristic modification unit cuts off the low-frequency range, and the harmonic signal generating unit generates the harmonics of the low-frequency range up to the nth order (n is an integer not less than three), which offers an advantage of being able to cause an user to perceive the cutoff low-frequency range virtually due to the psychoacoustic feature "Missing fundamental". In addition, since the controller controls both the output signals of the HPFs and the gain of the harmonic signals generated, it can vary the low-frequency range interpolation effects in accordance with the attenuation characteristics of the low-frequency range.

Embodiment 6

Although the embodiments 4 and 5 have a configuration that adds the output signal 2002 of the harmonic signal generating unit 2001 to the output signal of the HPF, a configuration is also possible which adds the output signal 2002 of the harmonic signal generating unit 2001 at a post-stage of the frequency characteristic modification unit 103.

Figure 16:
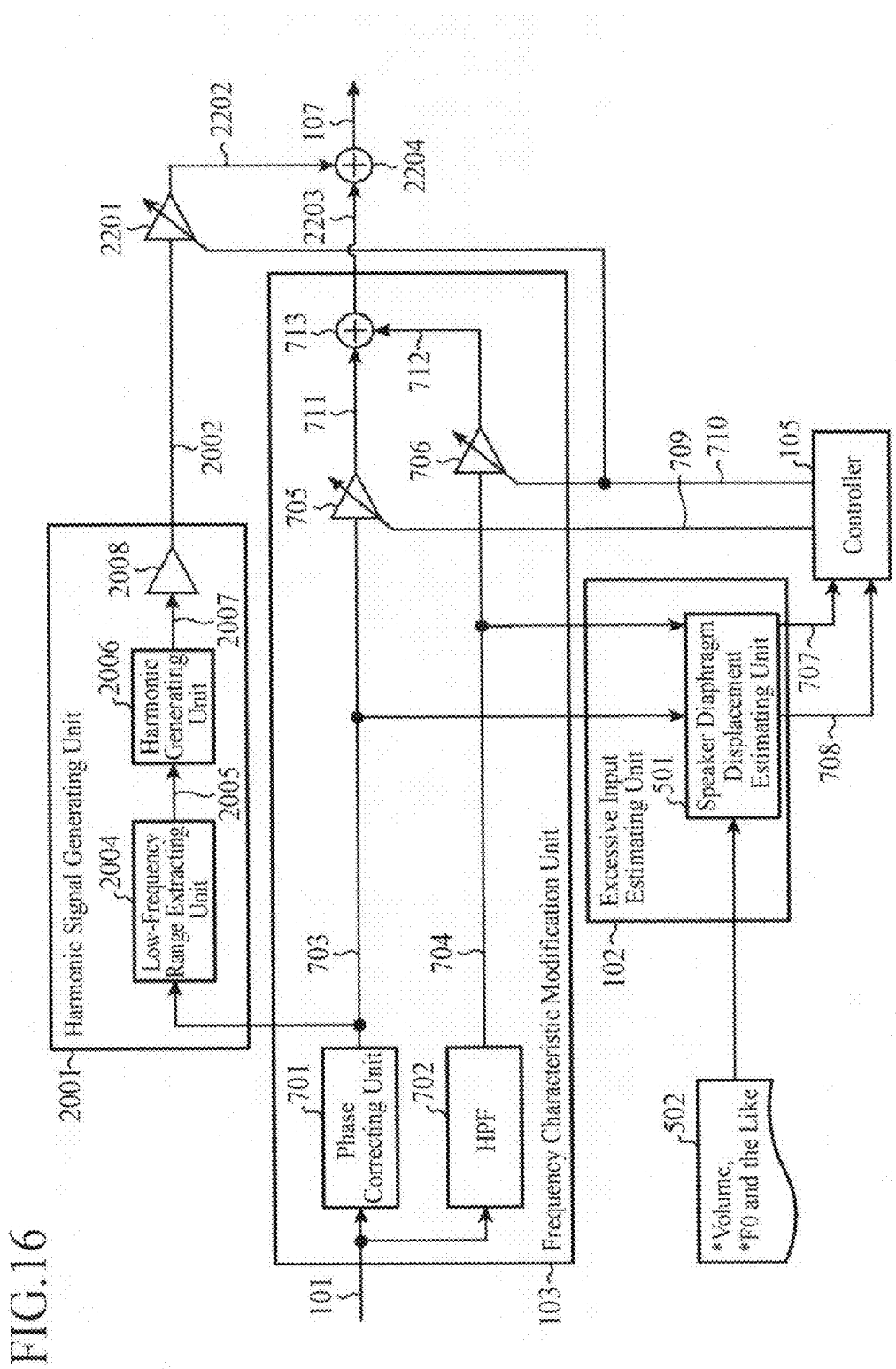
FIG. 16 is a diagram showing a principle of a frequency characteristic modification device of an embodiment 6.
Figure 17:
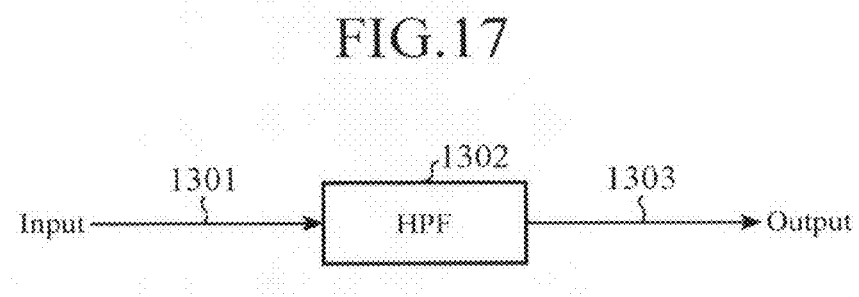
FIG. 17 is a diagram showing a principle of a conventional technique.
Figure 18:
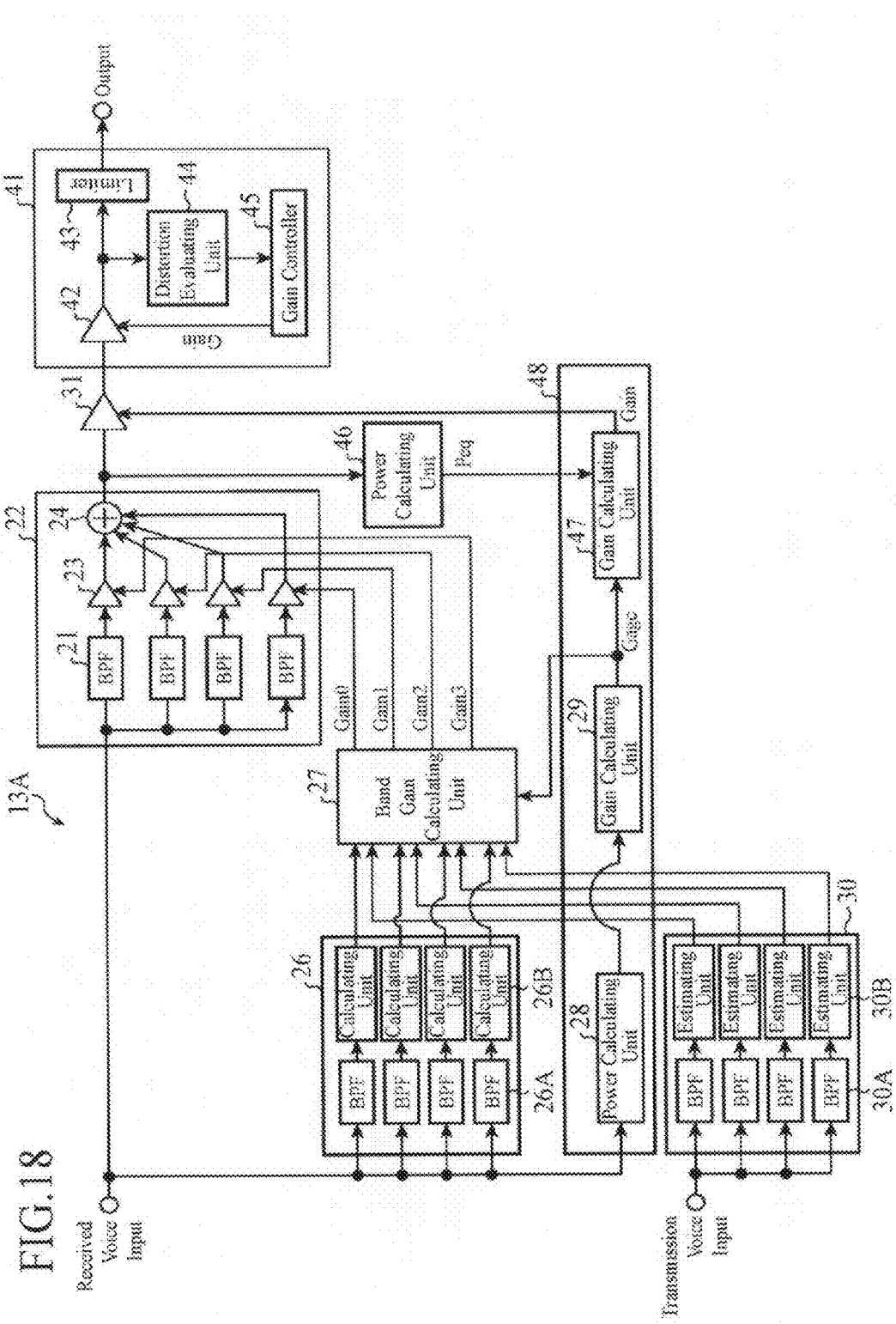
FIG. 18 is a processing block diagram of an amplitude limiting device of a conventional technique.

FIG. 16 is a diagram showing an embodiment of a configuration that alters the addition position of the output signal 2002 of the harmonic signal generating unit 2001 to the post-stage of the frequency characteristic modification unit 103 in the embodiment 4. The operation of the present embodiment will be described.

The input signal 101 input to a frequency characteristic modification device in accordance with the present invention is split and delivered to the phase correcting unit 701 and HPF 702.

The phase correcting unit 701, while maintaining the frequency amplitude characteristics of the input signal, corrects only its phase characteristics in such a manner that the phase characteristics become nearly equal to the phase characteristics of the HPF 702, and supplies the resultant signal 703 to the first multiplier 705, excessive input estimating unit 102 and harmonic signal generating unit 2001.

The HPF 702 carries out the filter processing of the input signal 101, and supplies the resultant signal 704 to the multiplier 706 and excessive input estimating unit 102.

Here, since the phase correcting unit can be implemented using an all-pass filter or a sampling-delay processing as in the embodiment 1, the detailed description thereof will be omitted.

The excessive input estimating unit 102 of the present embodiment comprises the speaker diaphragm displacement estimating unit 501. The speaker diaphragm displacement estimating unit 501 estimates the displacement of the speaker diaphragm when reproducing the signal 703 using the information 502 such as the volume and F0 of the target speaker, and obtains the first speaker diaphragm displacement 707. Likewise, it estimates the displacement of the speaker diaphragm when reproducing the signal 704, and obtains the second speaker diaphragm displacement 708.

As for a concrete example of the displacement estimation, since it is obtained in the same manner as that of the embodiment 1, its detailed description will be omitted.

The two speaker diaphragm displacements 707 and 708 the speaker diaphragm displacement estimating unit 501 obtains are supplied to the controller 105.

The controller 105 obtains two gain coefficients in such a manner that when the two input speaker diaphragm displacements 707 and 708 are multiplied by the gain coefficients which differ from each other, respectively, followed by addition, the absolute value of the amplitude comes within the prescribed threshold, where the sum of the two gain coefficients is assumed to be one.

Varying the two gain coefficients under such conditions can implement different low-frequency range attenuation effects. Since a concrete example of the low-frequency range attenuation effects has the same characteristics as that of the embodiment 1, the detailed description thereof will be omitted.

In addition, as for a concrete method of calculating the gain coefficients A1 and A2 in FIG. 16, where A1 is the gain coefficient for the speaker diaphragm displacement 707 and A2 is the gain coefficient for the speaker diaphragm displacement 708, since they are obtained in the same manner as in the embodiment 1, the description thereof will be omitted.

The value A1 the controller 105 obtains is supplied to the first multiplier 705 as the gain coefficient 709. Likewise, the value A2 is supplied to the second multiplier 706 and multiplier 2201 as the gain coefficient 710.

The first multiplier 705 multiplies the input signal 703 by the gain coefficient 709, and supplies the resultant signal 711 to the adder 713.

The second multiplier 706 multiplies the input signal 704 by the gain coefficient 710, and supplies the resultant signal 712 to the adder 713.

The adder 713 adds the two input signals 711 and 712, and outputs the resultant signal 2203 to an adder 2204.

The harmonic signal generating unit 2001 comprises the low-frequency range extracting unit 2004, harmonic generating unit 2006 and multiplier 2008.

The low-frequency range extracting unit 2004, receiving the output signal of the phase correcting unit 701, extracts the low-frequency range cut off through the HPF 702, and supplies the resultant signal 2005 to the harmonic generating unit 2006. Here, as for a method of implementing the low-frequency range extracting unit 2004 that extracts the low-frequency range cut off through the HPF 702, since it is obtained in the same manner as in the embodiment 4, the description thereof will be omitted.

The harmonic generating unit 2006 generates the harmonics of the output signal 2005 of the low-frequency range extracting unit 2004 up to the nth order (where n is an integer equal to or greater than three), and supplies the resultant signal 2007 to the multiplier 2008. Here, as for a method of implementing the harmonic generating unit 2006, it can be a method of generating both odd harmonics and even harmonics through waveform transformation such as peak hold, full-wave rectification, and half-wave rectification or through m-times of multiplication of the signal 2005 (where m is an integer) or frequency division.

The multiplier 2008 multiplies the output signal 2007 of the harmonic generating unit 2006 by a gain coefficient a user desires, and supplies the resultant signal 2002 to the multiplier 2201. Here, the gain coefficient the multiplier 2008 multiplies can be a plurality of fixed gain coefficients prepared in advance, which can be changed in accordance with the liking of the user.

The multiplier 2201 multiplies the input signal 2002 by the gain coefficient 710, and supplies the resultant signal 2202 to the adder 2204. Here, the multiplier 2201 can alter the amount of addition of the harmonics in the cutoff low-frequency range in accordance with the low-frequency range attenuation effects. As for the addition images of the harmonics corresponding to the low-frequency range attenuation effects, since they are the same as those of the embodiment 4, their description will be omitted.

The adder 2204 adds the two input signals 2202 and 2203, and outputs the resultant signal as the output signal 107.

As described above, according to the processing configuration of the embodiment 6, the frequency characteristic modification unit cuts off the low-frequency range, and the harmonic signal generating unit generates the harmonics of the low-frequency range up to the nth order (n is an integer not less than three), which offers an advantage of being able to cause an user to perceive the cutoff low-frequency range virtually due to the psychoacoustic feature "Missing fundamental". In addition, since the controller controls both the output signal of the HPF and the gain of the harmonic signal generated, it can vary the low-frequency range interpolation effect in accordance with the attenuation characteristics of the low-frequency range.

Incidentally, it is to be understood that a free combination of the individual embodiments, variations of any components of the individual embodiments or removal of any components of the individual embodiments is possible within the scope of the present invention.

INDUSTRIAL APPLICABILITY

As described above, a frequency characteristic modification device in accordance with the present invention can improve the distortion and crackling noise in the audio signal reproduction. Accordingly, it is applicable to an audio reproduction device and the like.

DESCRIPTION OF REFERENCE SYMBOLS

101 input signal; 102 excessive input estimating unit; 103 frequency characteristic modification unit; 105 controller; 107 output signal; 501 speaker diaphragm displacement estimating unit; 502 information; 701 phase correcting unit; 702 HPF; 705 first multiplier; 706 second multiplier; 713, 2003, 2125, 2126, 2127, 2204 adder; 901, 2012 LPF; 1101 first HPF; 1102 second HPF; 1103 third HPF; 1107 first phase correcting unit; 1108 second phase correcting unit; 1109 third phase correcting unit; 1113 first multiplier; 1114 second multiplier; 1115 third multiplier; 2001 harmonic signal generating unit; 2004 low-frequency range extracting unit; 2006 harmonic generating unit; 2008, 2119, 2120, 2121, 2201 multiplier; 2011 difference calculator; 2101 first LPF; 2102 second LPF; 2103 third LPF; 2107 fourth phase correcting unit; 2108 fifth phase correcting unit; 2109 sixth phase correcting unit; 2113 first harmonic generating unit; 2114 second harmonic generating unit; 2115 third harmonic generating unit.

What is claimed is:

1. A frequency characteristic modification device comprising:
    a filter that modifies frequency characteristics of a target signal;
    a phase correcting unit that corrects phase characteristics of the target signal to make the phase characteristics nearly equal to phase characteristics of the filter;
    a first multiplier that adjusts gain of a signal output from the phase correcting unit;
    a second multiplier that adjusts gain of a signal output from the filter;
    a coefficient determining controller that determines gain coefficients of the first and second multipliers in a manner that a sum of the gain coefficient of the first multiplier and the gain coefficient of the second multiplier becomes a constant value; and
    an adder that adds the two signals supplied from the first multiplier and second multiplier.

2. The frequency characteristic modification device according to claim 1, wherein
    the filter comprises a high-pass filter; and
    the coefficient determining controller alters a cutoff frequency of target characteristics by bringing the gain coefficient of the second multiplier closer to a maximum value when increasing the cutoff frequency of the target characteristics, and by bringing the gain coefficient of the second multiplier closer to zero when reducing the cutoff frequency of the target characteristics.

3. The frequency characteristic modification device according to claim 2, further comprising:
    a low-frequency range extracting unit that extracts a low-frequency range cut off through the high-pass filter; and
    a harmonic generating unit that generates harmonics of a signal output from the low-frequency range extracting unit.

4. The frequency characteristic modification device according to claim 2, further comprising:
    a low-frequency range extracting unit that extracts a low-frequency range cut off through the high-pass filter;
    a harmonic generating unit that generates harmonics of a signal output from the low-frequency range extracting unit; and
    an adder that adds a signal output from the harmonic generating unit and the signal output from the high-pass filter, wherein the frequency characteristic modification device:
    alters gain of a signal output from the adder with the second multiplier, and alters gain of the signal output from the harmonic generating unit in accordance with attenuation characteristics of the low-frequency range.

5. The frequency characteristic modification device according to claim 2, further comprising:
    a low-frequency range extracting unit that extracts a low-frequency range cut off through the high-pass filter;
    a harmonic generating unit that generates harmonics of a signal output from the low-frequency range extracting unit; and
    a multiplier that multiplies the signal output from the harmonic generating unit by the gain coefficient the second multiplier multiplies, wherein the frequency characteristic modification device:
    alters gain of the signal output from the harmonic generating unit in accordance with the attenuation characteristics of the low-frequency range.

6. The frequency characteristic modification device according to claim 1, wherein
    the filter comprises a low-pass filter; and
    the coefficient determining controller alters a cutoff frequency of target characteristics by bringing the gain coefficient of the second multiplier closer to zero when increasing the cutoff frequency of the target characteristics, and by bringing the gain coefficient of the second multiplier closer to a maximum value when reducing the cutoff frequency of the target characteristics.

7. A frequency characteristic modification device comprising:
    a filter that modifies frequency characteristics of a target signal, comprising a plurality of high-pass filters with different cutoff frequencies which generate a plurality of filter output signals by passing the target signal through the plurality of high-pass filters;
    phase correcting units that correct the phase characteristics of the filter output signals to make the phase characteristics of the individual filter output signals nearly equal to each other by using phase correcting units corresponding to phase characteristics of the individual high-pass filters;

a plurality of multipliers that adjust gains of signals output from the high-pass filters and the phase correcting units; and a coefficient determining controller that determines individual gain coefficients in a manner that the sum of the gain coefficients of the plurality of multipliers becomes a fixed value, said coefficient determining controller configured to:

bring the gain coefficient of the multiplier corresponding to the output signal from the filter with a lower cutoff frequency closer to a maximum value when lowering the cutoff frequency of the target characteristics, and to bring the gain coefficient of the multiplier corresponding to the output signal from the filter with a higher cutoff frequency closer to a maximum value when raising the cutoff frequency of the target characteristics, and assign weights to the phase-corrected individual filter output signals in accordance with the individual gain coefficients the coefficient determining controller determines, and causes an adder to add the individual signals passing through the weighting, thereby altering the cutoff frequency of the target characteristics.

8. The frequency characteristic modification device according to claim 7, further comprising:
a low-frequency range extracting unit that extracts a low-frequency range cut off through the high-pass filter; and
a harmonic generating unit that generates harmonics of a signal output from the low-frequency range extracting unit.

9. The frequency characteristic modification device according to claim 7, further comprising:
a plurality of low-frequency range extracting units that extract low-frequency ranges cut off through the high-pass filters;
a plurality of harmonic generating units that generate harmonics of signals output from the plurality of low-frequency range extracting units; and
a plurality of adders that add signals output from the harmonic generating units and signals output from the high-pass filters, wherein the frequency characteristic modification device:
alters gain of a plurality of signals output from the adders with the plurality of multipliers of claim 4, and alters gain of the plurality of signals output from the harmonic generating units in accordance with attenuation characteristics of the low-frequency ranges.

10. The frequency characteristic modification device according to claim 7, further comprising:
a plurality of low-frequency range extracting units that extract low-frequency ranges cut off through the high-pass filters;
a plurality of harmonic generating units that generate harmonics of signals output from the plurality of low-frequency range extracting units; and
a plurality of multipliers that multiply signals output from the plurality of harmonic generating units by the plurality of gain coefficients the multipliers of claim 4 multiply, wherein the frequency characteristic modification device:
alters gain of the plurality of signals output from the harmonic generating units in accordance with the attenuation characteristics of the low-frequency ranges.

11. A frequency characteristic modification device comprising:
a filter that modifies frequency characteristics of a target signal, comprising a plurality of low-pass filters with different cutoff frequencies which generate a plurality of filter output signals by passing the target signal through the plurality of low-pass filters;
phase correcting units that correct the phase characteristics of the filter output signals to make the phase characteristics of the individual filter output signals nearly equal to each other by using phase correcting units corresponding to phase characteristics of the individual low-pass filters;
a plurality of multipliers that adjust gains of signals output from the low-pass filters and the phase correcting units; and a coefficient determining controller that determines individual gain coefficients in a manner that the sum of the gain coefficients of the plurality of multipliers becomes a fixed value, said coefficient determining controller configured to:
bring the gain coefficient of the multiplier corresponding to the output signal from the filter with a lower cutoff frequency closer to a maximum value when lowering the cutoff frequency of the target characteristics, and to bring the gain coefficient of the multiplier corresponding to the output signal from the filter with a higher cutoff frequency closer to a maximum value when raising the cutoff frequency of the target characteristics, and
assign weights to the phase-corrected individual filter output signals in accordance with the individual gain coefficients the coefficient determining controller determines, and causes an adder to add the individual signals passing through the weighting, thereby altering the cutoff frequency of the target characteristics.

* * * * *

UNITED STATES PATENT AND TRADEMARK OFFICE
CERTIFICATE OF CORRECTION

PATENT NO. : 9,552,826 B2
APPLICATION NO. : 14/373721
DATED : January 24, 2017
INVENTOR(S) : Masaru Kimura et al.

Page 1 of 1

It is certified that error appears in the above-identified patent and that said Letters Patent is hereby corrected as shown below:

Column 21, Line 45, change "4" to --7--; and

Column 22, Line 9, change "4" to --7--.

Signed and Sealed this
Tenth Day of April, 2018

Andrei Iancu
*Director of the United States Patent and Trademark Office*